(12) United States Patent
Williams (10) Patent No.: US 8,607,993 B2
(45) Date of Patent: Dec. 17, 2013

(54) TOOL-LESS CABLE MANAGEMENT ATTACHMENT BRACKET AND METHOD OF USE

(75) Inventor: Tiffany J. Williams, Austin, TX (US)

(73) Assignee: Dell Products L.P., Round Rock, TX (US)

(*) Notice: Subject to any disclaimer, the term of this patent is extended or adjusted under 35 U.S.C. 154(b) by 1841 days.

(21) Appl. No.: 11/620,823

(22) Filed: Jan. 8, 2007

(65) Prior Publication Data

US 2008/0164789 A1 Jul. 10, 2008

Related U.S. Application Data

(62) Division of application No. 10/393,620, filed on Mar. 21, 2003, now Pat. No. 7,168,576.

(51) Int. Cl.
*A47F 7/00* (2006.01)

(52) U.S. Cl.
USPC .......................................................... 211/26

(58) Field of Classification Search
USPC ......... 211/26, 183, 151, 175; 312/334.5, 333, 312/334.8, 323; 248/282.1, 49
See application file for complete search history.

(56) References Cited

U.S. PATENT DOCUMENTS

| | | | | |
|---|---|---|---|---|
| 3,133,768 A * | 5/1964 | Klakovich | ....................... | 384/17 |
| 3,680,711 A | 8/1972 | Brucker | ....................... | 211/105.3 |
| 3,697,034 A | 10/1972 | Shell | ............................. | 248/243 |
| 4,184,726 A | 1/1980 | Cox | ............................. | 312/320 |
| 4,406,374 A | 9/1983 | Yedor | ........................... | 211/192 |
| 4,731,029 A | 3/1988 | Lerner et al. | ....................... | 439/4 |
| 4,931,907 A | 6/1990 | Robinson et al. | ............. | 361/391 |
| 5,018,052 A | 5/1991 | Ammon et al. | ................. | 361/428 |
| 5,216,579 A | 6/1993 | Basara et al. | .................. | 361/383 |
| 5,460,441 A | 10/1995 | Hastings et al. | .............. | 312/298 |
| 5,505,533 A | 4/1996 | Kammersgard et al. | ...... | 312/236 |
| 5,546,277 A | 8/1996 | Zandbergen | | |
| 5,571,256 A | 11/1996 | Good et al. | ....................... | 211/26 |
| 5,579,924 A | 12/1996 | Sands et al. | ...................... | 211/26 |
| 5,655,738 A | 8/1997 | Ragsdale et al. | ............. | 248/68.1 |
| 5,684,671 A | 11/1997 | Hobbs et al. | .................. | 361/683 |
| 5,791,498 A | 8/1998 | Mills | ............................... | 211/26 |
| 5,833,337 A * | 11/1998 | Kofstad | ........................ | 312/334.5 |
| 5,850,925 A | 12/1998 | Gandre | ........................... | 211/26 |
| 5,890,602 A | 4/1999 | Schmitt | ........................... | 211/26 |
| 5,893,593 A | 4/1999 | Dowling | ................... | 292/336.3 |

(Continued)

OTHER PUBLICATIONS

Pending U.S. Appl. No. 10/278,263 entitled "System and Method for Rack Cable Management" by Corey D. Hartman, et al.; Dell Products L.P., filed Oct. 23, 2002.

(Continued)

*Primary Examiner* — Darnell Jayne
*Assistant Examiner* — Kimberley S Wright
(74) *Attorney, Agent, or Firm* — Baker Botts L.L.P.

(57) ABSTRACT

A cable management attachment bracket is disclosed that includes a bracket body with a first attachment tab, a second attachment, and a cable management assembly (CMA) connection point for hingedly connecting with a CMA. The first attachment tab extends from a front edge of the bracket body and is formed to interface with a first receiving portion of a rack slide. The second attachment tab extends from a center portion of the bracket body and is formed to interface with a second receiving portion of a rack slide. Additionally, the CMA connection point is formed on the rear edge of the bracket body.

7 Claims, 7 Drawing Sheets

(56) References Cited

U.S. PATENT DOCUMENTS

| | | | |
|---|---|---|---|
| 5,921,402 A | 7/1999 | Magenheimer | 211/26 |
| 5,941,621 A | 8/1999 | Boulay et al. | A47B 88/00 |
| 6,011,701 A | 1/2000 | Kopp et al. | 361/818 |
| 6,021,047 A | 2/2000 | Lopez et al. | 361/727 |
| 6,021,909 A | 2/2000 | Tang et al. | |
| 6,070,742 A | 6/2000 | McAnally et al. | 211/26 |
| 6,070,841 A | 6/2000 | Robinson | 248/220.43 |
| 6,070,957 A | 6/2000 | Zachrai | 312/334.4 |
| 6,071,742 A | 6/2000 | Tracy et al. | 435/320.1 |
| 6,095,345 A | 8/2000 | Gibbons | 211/26 |
| 6,142,590 A | 11/2000 | Harwell | 312/223.1 |
| 6,181,549 B1 | 1/2001 | Mills et al. | 361/683 |
| 6,185,092 B1 | 2/2001 | Landrum et al. | 361/683 |
| 6,185,098 B1 | 2/2001 | Benavides | 361/695 |
| 6,223,908 B1 | 5/2001 | Kurtsman | 211/26 |
| 6,230,903 B1 | 5/2001 | Abbott | 361/829 |
| 6,273,534 B1 | 8/2001 | Bueley et al. | 312/334.8 |
| 6,297,962 B1 | 10/2001 | Johnson et al. | 361/726 |
| 6,303,864 B1 * | 10/2001 | Johnson et al. | 174/69 |
| 6,305,556 B1 | 10/2001 | Mayer | 211/26 |
| 6,326,547 B1 | 12/2001 | Saxby et al. | 174/69 |
| 6,365,834 B1 | 4/2002 | Larsen et al. | 174/100 |
| 6,373,721 B2 | 4/2002 | Lecinski et al. | 361/826 |
| 6,398,041 B1 | 6/2002 | Abbott | 211/26 |
| 6,398,149 B1 | 6/2002 | Hines et al. | 242/399 |
| 6,407,933 B1 | 6/2002 | Bolognia et al. | 361/826 |
| 6,422,399 B1 | 7/2002 | Castillo et al. | 211/26 |
| 6,429,376 B1 | 8/2002 | Mendoza | 174/97 |
| 6,431,668 B1 | 8/2002 | Reddicliffe | 312/334.5 |
| 6,435,354 B1 * | 8/2002 | Gray et al. | 211/26 |
| 6,523,918 B1 * | 2/2003 | Baiza | 312/265.1 |
| 6,554,142 B2 * | 4/2003 | Gray | 211/26 |
| 6,715,718 B1 * | 4/2004 | Chen et al. | 248/49 |
| 6,805,248 B2 * | 10/2004 | Champion et al. | 211/26 |
| 6,811,039 B2 * | 11/2004 | Chen et al. | 211/26 |
| 6,854,605 B2 * | 2/2005 | Wrycraft | 211/26 |
| 6,945,504 B2 * | 9/2005 | Chen et al. | 248/282.1 |
| 7,026,551 B2 * | 4/2006 | Franz et al. | 174/69 |
| 7,168,576 B2 * | 1/2007 | Williams | 211/26 |
| 7,255,409 B2 * | 8/2007 | Hu et al. | 312/334.4 |
| 7,281,633 B2 * | 10/2007 | Hartman et al. | 211/26 |
| 7,357,468 B2 * | 4/2008 | Hwang et al. | 312/333 |
| 7,473,846 B2 * | 1/2009 | Doerr et al. | 174/69 |
| 7,520,577 B2 * | 4/2009 | Chen et al. | 312/334.46 |
| 2003/0026084 A1 | 2/2003 | Lauchner | 361/826 |
| 2003/0123832 A1 | 7/2003 | Adapathya et al. | 385/135 |
| 2004/0056155 A1 * | 3/2004 | Chen et al. | 248/49 |
| 2004/0108289 A1 * | 6/2004 | Chen et al. | 211/183 |

OTHER PUBLICATIONS

Pending U.S. Appl. No. 10/675,102 entitled "Cable Management Flip Tray Assembly" by Daniel G. Lee, et al.; Dell Products L.P., filed Sep. 30, 2003.
Pending U.S. Appl. No. 09/518,841 entitled "Rack Mount Side System Enabling Front Top and Rear Access to a Rack Mounted Device" by Alfred Rafi Baddour, et al.; Dell Products L.P., filed Mar. 3, 2000.
Pending U.S. Appl. No. 10/206,302 entitled "System and Method for Utilizing Non-Dedicated Rack Space" by Terrence Q.E. Rafferty et al.; Dell Products L.P., filed Jul. 26, 2002.
Figures for Pending U.S. Appl. No. 10/206,302 entitled "System and Method for Utilizing Non-Dedicated Rack Space" by Terrance Q.E. Rafferty et al.; Dell Products L.P., filed Jul. 26, 2002.
Figures for Pending U.S. Appl. No. 10/278,263 entitled "System and Method for Rack Cable Management" by Corey D. Hartman, et al.; Dell Products L.P., filed Oct. 23, 2002.
Figures filed in Pending U.S. Appl. No. 09/518,541 entitled "Rack Mount Slide System Enabling Front, Top and Rear Access to a Rack Mounted Device" by Baddour et al., assigned to Dell Products L.P., filed Mar. 3, 2000.
Figures for Pending U.S. Appl. No. 10/675,102 entitled "Cable Management Flip Tray Assembly" by Daniel G. Lee, et al.; Dell Products L.P., filed Sep. 30, 2003.
Cabling Reference for the HP NetServer LXr Pro, Chapter 4, pp. 46-48.
IBM Megstar MP 3570 Tape Subsystem OPerator Guide C-Series Models "Installing the Rack-Mounted 3570" pp. 86-98.
IBM Megstar MP 3570 Tape Subsystem Operator Guide C-Series Models Attaching SCSI and Power Cables to Model C21 (Single Drive with Single Host) 1 page.
J1478A—HP Cable Management Arm for LHx000r by Hewlett Packard 1 page, Feb. 24, 2000.
Compaq AlphaServer ES40 Rackmount System Installation Guidfe "Installing the Cable Management Arm." pp. 18-21.
Compaq ProLiant ML350 Tower-to-Rack Conversion Guide 2 pages.
Campaq Rack Products Reference Guide "Installing Components in the Rack," 5 pages.
Maintenance and Service Guide "Illustrated Parts Catalog Chapter 1—Illustrating the family of Compaq Rack-Mountable ProLiant 1500R Servers," 3 pages.
Compaq ProLiant DL360 Ultra-Dense Server Deployment in Compaq Racks "4.6.3.2. Sliding-Rail Cable Management" pp. 89-90.
Netra t1 and Netra st D130 Rackmount Installation Chapter 2 pp. 9-14.

* cited by examiner

TOOL-LESS CABLE MANAGEMENT ATTACHMENT BRACKET AND METHOD OF USE

RELATED APPLICATION

This application is a divisional of and claims priority from U.S. patent application Ser. No. 10/393,620 filed Mar. 21, 2003 now U.S. Pat. No. 7,168,576, the contents of which is hereby incorporated by reference in its entirety.

TECHNICAL FIELD

The following disclosure relates in general to the field of electronics equipment racks and more particularly to a tool-less cable management attachment bracket and method of use thereof.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems and information handling system components are often stored in rack systems such as EIA-310 standard racks. Rack systems often include rack slide assemblies attached on either side of a rack for mounting information handling system components. The rack slide assemblies allow the information handling system to be moved from an installed or retracted position within the rack to a position extended from the rack to allow for inspection, maintenance, installation and removal of the information handling system component.

Cable management assemblies (CMA) are utilized to hold and manage cabling associated with the information handling system. CMAs typically include two or more hinged arm components. When an associated information handling system component is in a retracted or installed position, the arms of the CMA fold behind the component. When the component is brought to the extended position, the CMA unfolds or extends. CMAs are typically attached to the information handling system component chassis at one end and to the rack at the other end. One problem associated with CMAs is that the attachment to the back of the chassis takes up valuable space on the back of the chassis. This is particularly problematic for slimmer components (such as components designed to fit into an IU space). Another problem is that this attachment typically requires loose fasteners—adding additional parts to the installation of the CMA.

SUMMARY

Therefore a need has arisen for a system and method of attaching a CMA that maximizes rear surface space of an associated chassis.

A further need has arisen for a system for associating a CMA with an information handling system component that does not require loose fasteners. In accordance with teachings of the present disclosure, a system and method are described for associating a CMA with an information handling system component chassis that reduces or eliminates problems associated with previous CMA attachment methods.

In one aspect an information handling system is disclosed that includes a rack for storing information handling system components. The rack includes multiple rails where each rack rail has a standard interface. The standard interface includes multiple mounting units where each mounting unit has a first aperture, a second aperture, and a third aperture. The information handling system also includes a pair of rack slide assemblies that each include a stationary member able to attach to the standard interface of the rack rails and a slide member slidably engaged with the stationary member. A first receiving portion and a second receiving portion are formed in the slide member. A cable management arm bracket includes a first attachment tab that is sized to interface with the first receiving portion, a second attachment tab formed to interface with the second receiving portion, and a cable management assembly (CMA) connection point for connecting with a cable management assembly.

In another aspect, a cable management arm bracket is disclosed that includes a bracket body with a first attachment tab, a second attachment, and a cable management assembly (CMA) connection point for hingedly connecting with a CMA. The first attachment tab extends from a front edge of the bracket body and is formed to interface with a first receiving portion of a rack slide. The second attachment tab extends from a center portion of the bracket body and is formed to interface with a second receiving portion of a rack slide. Additionally, the CMA connection point is formed on the rear edge of the bracket body.

In yet another aspect, a method for attaching a cable management assembly to a rack is disclosed. The method includes attaching a rack slide assembly that has a stationary member and a slide member to a rack. The method also includes providing a cable management arm bracket that has a first attachment tab, a second attachment tab and a CMA connection point. The cable management arm bracket is then secured to the rack slide assembly by aligning the first attachment tab and the second attachment tab with a first receiving portion and a second receiving portion formed in the slide member. A first end of a cable management assembly is then secured to the rack and the second end of the cable management assembly is secured to the connection point of the cable management arm bracket.

The present disclosure includes a number of important technical advantages. One technical advantage is providing a CMA attachment bracket with attachment tabs for interfering with a rack slide. This allows for a CMA to be associated with an information handling system component without taking up valuable space on the back of the component chassis. Additionally, the attachment tabs allow for the attachment bracket to be tool-lessly installed. Additional advantages are described in the description, Figures and Claims.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 9, wherein like numbers are used to indicate like and corresponding parts.

For purposes of this disclosure, an information handling system or information handling system components may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components. Information handling systems and components are often stored in racks such as Electronics Industry Association Standard 310 compliant racks.

Figure 1A:
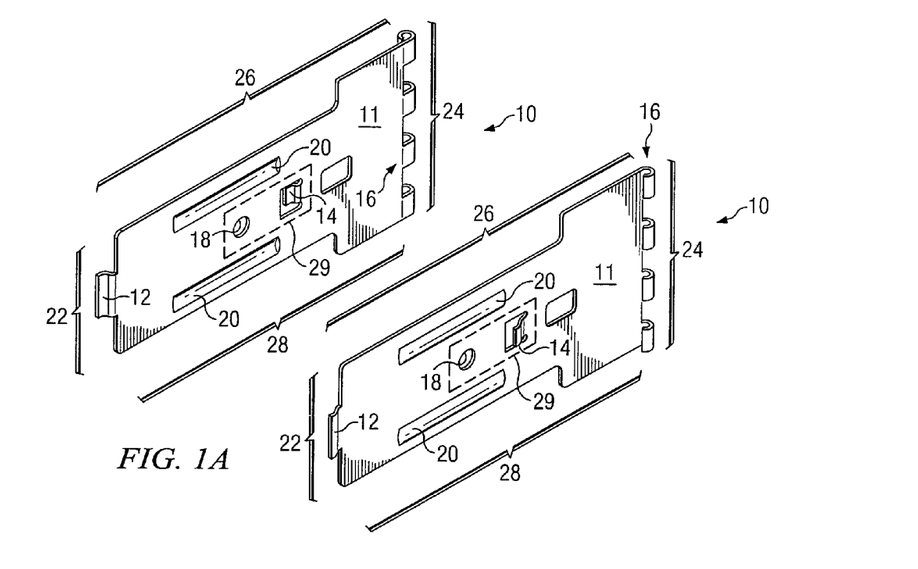
FIG. 1A shows an isometric view of a pair of cable management attachment brackets according to teachings of the present disclosure.

Now referring to FIG. 1A, an isometric view of a pair of cable management attachment brackets 10 are shown. Each cable management attachment bracket 10 includes a bracket body 11 that is generally flat, having a front edge 22, a rear edge 24, a top edge 26, and a bottom edge 28. In the present embodiment, bracket body 11 is narrower at front edge 22 and wider at rear edge 24. In alternative embodiments, however, bracket body may have a uniform height throughout its length.

In the present embodiment, first attachment tab 12 extends from front edge 22 and second attachment tab 14 extends from a middle portion 29 of cable management attachment bracket 10. In the present embodiment, first attachment tab 12 and second attachment tab 14 extend outward from the plane of bracket body 11 and form an interface surface in plane substantially parallel to the plane of bracket body 11.

Figure 1B:
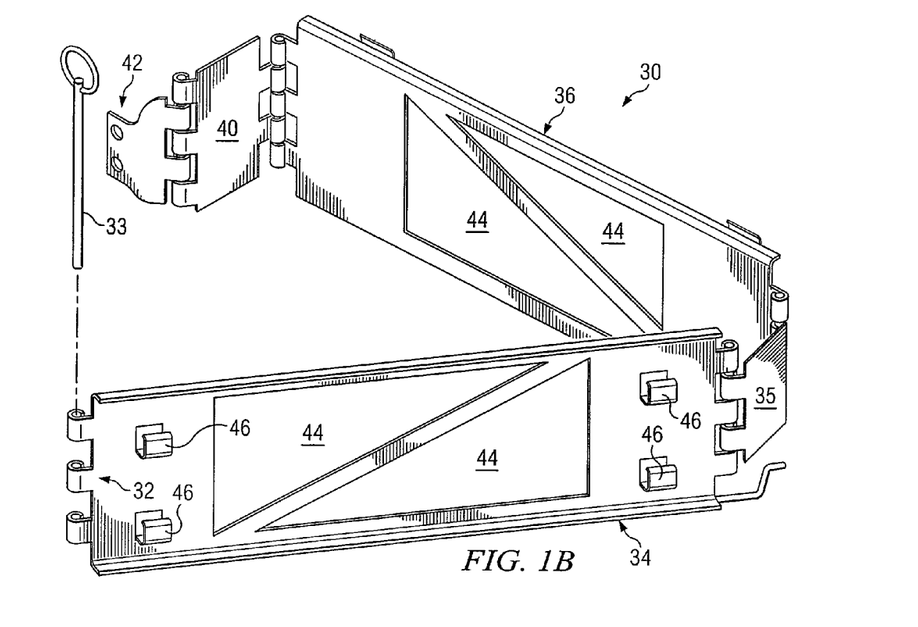
FIG. 1B shows an isometric view of a cable management assembly (CMA)

A CMA connection point 16 is formed on the rear edge 24 of bracket body 11. In the present embodiment, connection point 16 is a hinged connection point comprising four cylindrical hinge elements offset from one another to allow mating hinge elements (as shown in FIG. 1B) to interlace therewith and to be secured with a pin 33. The present disclosure contemplates alternate CMA connection points utilizing any suitable configuration of hinge elements.

Figure 1C:
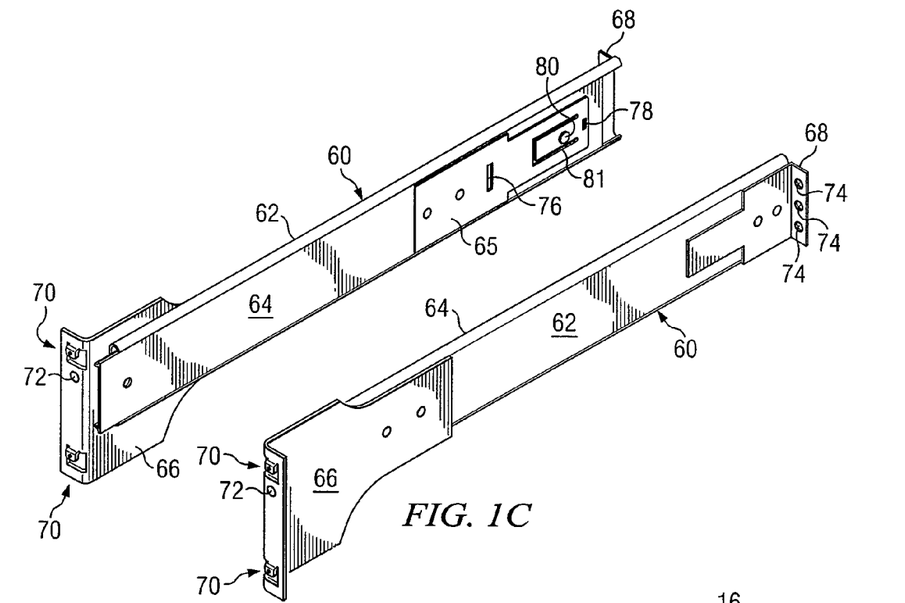
FIG. 1C shows an isometric view of a pair of rack slide assemblies.
Figure 7:
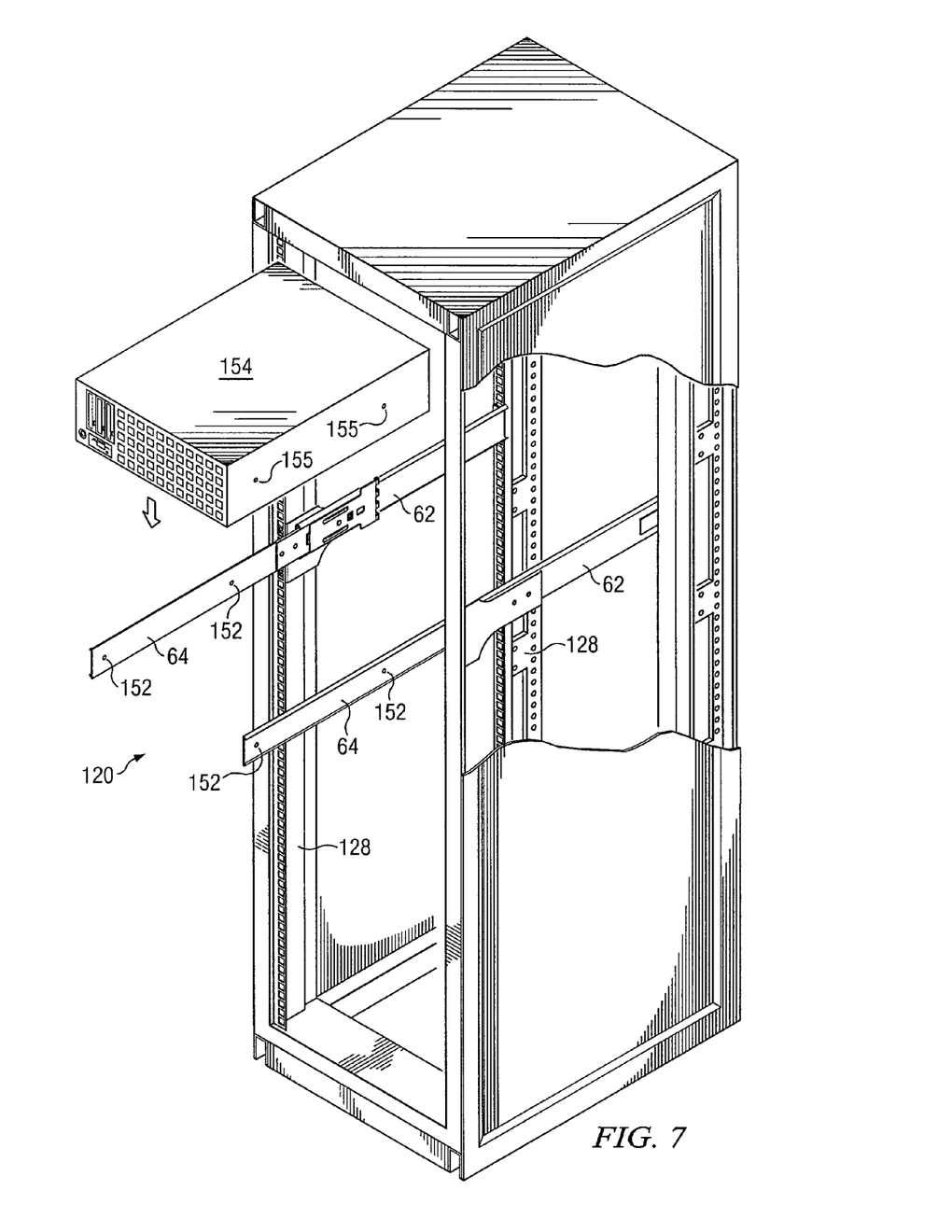
FIG. 7 shows the installation of an information handling system chassis in a rack according to teachings of the present disclosure.

Bracket body 11 further includes raised embosses 20 formed thereon. In the present embodiment, embosses 20 are spaced apart from one another and are formed substantially parallel to the length of bracket body 11. Embosses 20 preferably have a thickness to contact or wedge bracket body 11 between a slide member 64 (as shown in FIG. 1C) and a chassis 154 (as shown in FIG. 7) so as to resist the torque associated with the weight of an attached CMA (as shown in FIG. 1B).

A button receiving aperture 18 is also formed in bracket body 11. Button receiving aperture is formed to house a locking button 80 (as shown in FIG. 1C) such that the locking button secures the bracket body 11 to slide member 64 when locking button is in an extended or locked position. Locking button 80 may be pushed into a retracted position to allow bracket body 11 to be removed from slide member 64.

Now referring to FIG. 1B, a Cable Management Assembly (CMA) depicted generally at 30 is shown. CMA 30 includes bracket connector 32, hingedly connected to first arm 34. First arm 34 is hingedly connected to second arm 36. In the present embodiment, a dual hinge 35 is utilized to connect first arm 34 and second arm 36. Second arm 36 is then connected in a second dual hinge 40 to rack connector 42.

First arm 34 and second arm 36 each include openings 44 formed therein to allow air flow therethrough and decrease weight. First arm 34 and second arm 36 each also includes cable attachment loops 46 which may be used to secure cabling to first arm 34 and second arm 36.

Bracket connector 32 is a hinged bracket connector formed to mate with CMA connection point 16 as described above. In the present embodiment, bracket connector 32 includes three hinge elements that may be hingedly interfaced with CMA connection point 16 and secured with connection pin 33.

Rack connector 42 includes one or more interface apertures to allow rack connector 42 to be secured to a portion of a rack such as an EIA-310 type rack.

Note that the present disclosure contemplates the use of cable management bracket with any suitable CMA, including CMAs with more than two arms.

Figures 5A, 5B:
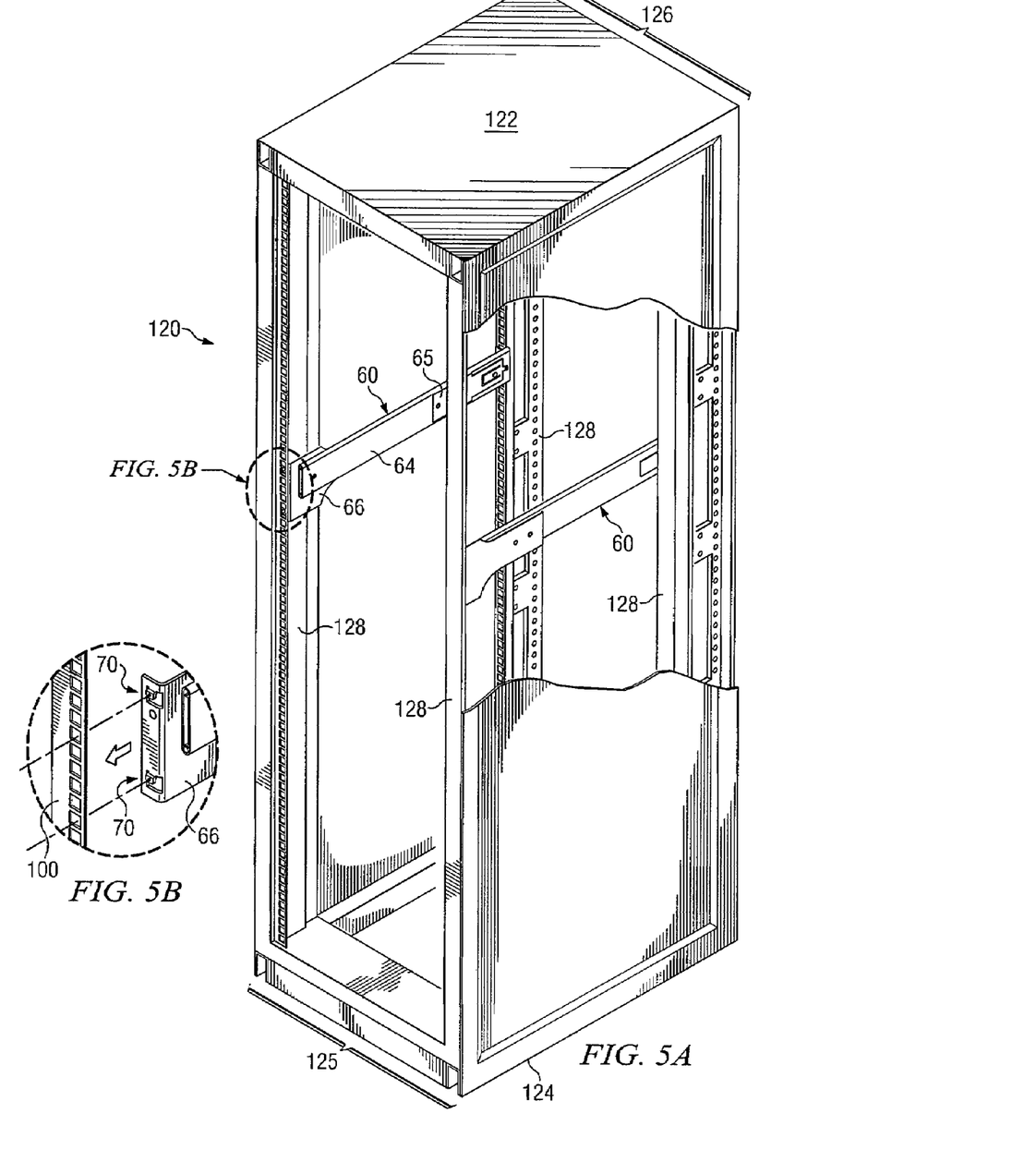
FIG. 5A shows a rack with a rack slide assembly installed therein in a retracted position.
FIG. 5B shows an enlarged view of a front interface bracket and the interface portion of a rack rail.

Now referring to FIG. 1C, a pair of rack slide assemblies 60 is depicted. Rack slide assemblies 60 includes stationary member 62 with a front rack interface bracket 66 and a rear rack interface bracket 68. In the present embodiment, each front rack interface bracket 66 includes two rack interface tabs 70 and an aperture 72. Interface tabs 70 preferably allow front rack interface bracket 66 to tool-lessly connect with a rack rail (as shown in FIG. 5A). Additionally, aperture 72 may be used with a thumb screw or another suitable fastener to secure front bracket interface bracket 66 to a rack rail. In alternate embodiments, front rack interface bracket 66 may include only apertures to allow bracket 66 to be secured to a rack rail.

Also in the present embodiment, rear rack interface bracket 68 includes several apertures 74 to allow the rear rack interface bracket 68 to be secured to a rack rail. In an alternate embodiment, rear rack interface bracket may include one or more attachment tabs or hooks to allow rear rack interface bracket 68 to be tool-lessly attached to a rack rail such as the tool-less interface of so-called "rapid rail" products sold by the Dell Computer Corporation. In alternative embodiments, rack slide assemblies may utilize front and rear interface brackets that utilize loose fasteners such as the interface brackets of so-called "versa rail" products sold by the Dell Computer Corporation.

Figures 6A, 6B:
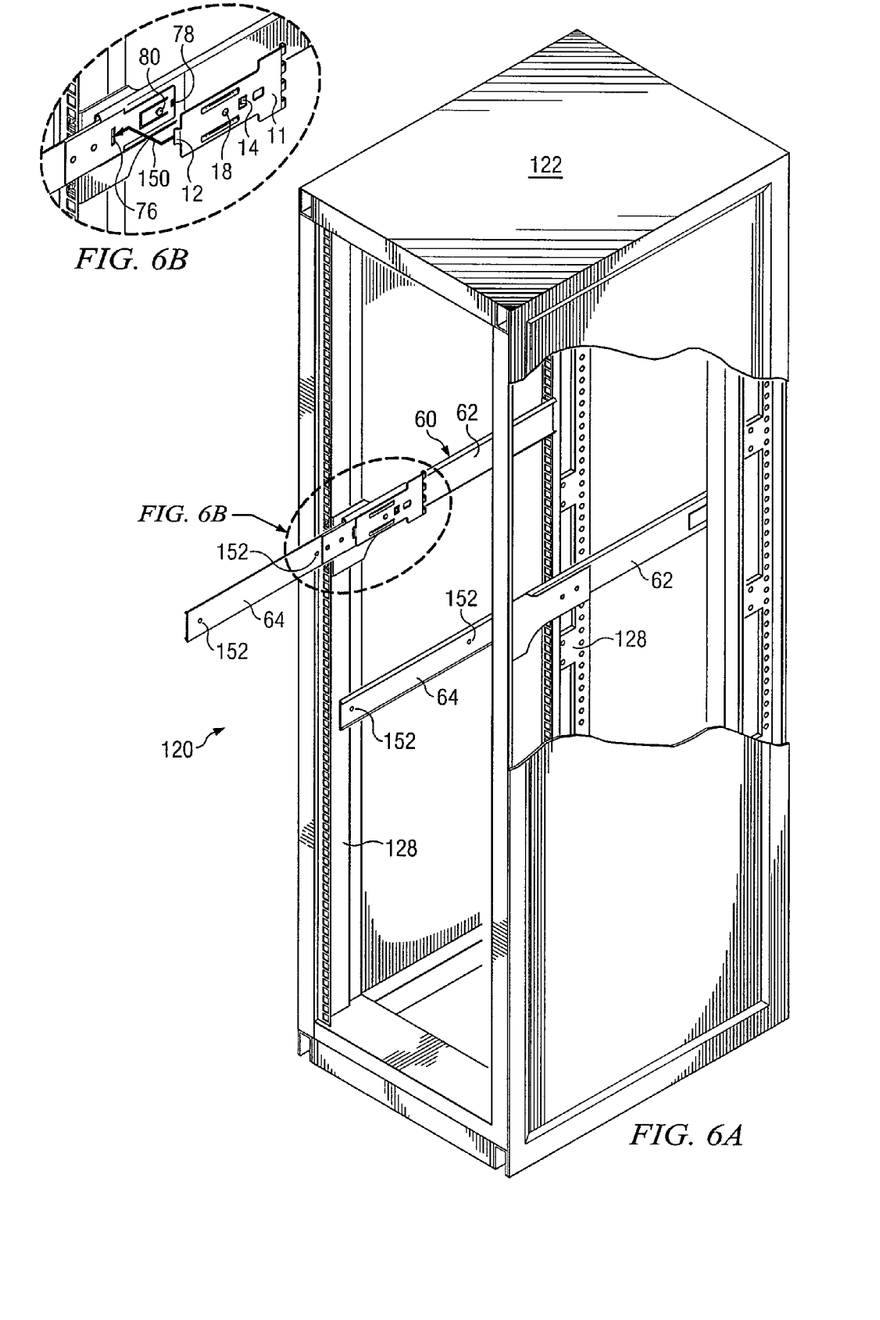
FIG. 6A shows a rack with a rack slide assembly in an extended position.
FIG. 6B shows an exemplary view of the interfacing of a cable management attachment bracket to a slide member.

Rack slide assemblies each also include at least one slide member 64 that is slidably engaged with stationary member 62. Note that in alternate embodiments, an additional slide member is disposed between and slidably engaged with both slide member 64 and stationary member 62—allowing slide member 64 to telescope out from stationary member 62. In the present embodiment, slide member 64 is movable between a nested or retracted position (as shown) or an extended position (as shown in FIG. 6A).

Slide bracket is attached to slide member 64. Slide bracket 65 includes first receiving portion 76 and second receiving portion 78. In the present embodiment, first receiving portion 76 is a slot formed to interface with first attachment tab 12 (as shown in FIG. 1) and second receiving portion 78 is a slot formed to interface with a second attachment tab 14 (as shown in FIG. 1). Note that in alternate embodiments, first receiving portion 76 and second receiving portion may comprise any suitable configuration for tool-lessly interfacing with attachment tabs extending from a bracket body.

Slide bracket 65 also includes a locking button 80 disposed thereto. Locking button 80 is preferably mountable between a recessed and a locking position. Locking button is disposed on longitudinal spring 81 allowing locking button to be depressed into the recessed position and urging locking button 80 into a locking or extended position.

In the present embodiment, slide bracket 65 is preferably attached to slide member 64 using rivets, although any suitable fastener may be used. In alternate embodiments, the interface features of slide bracket 65 may be incorporated into slide member 64.

Figure 2:
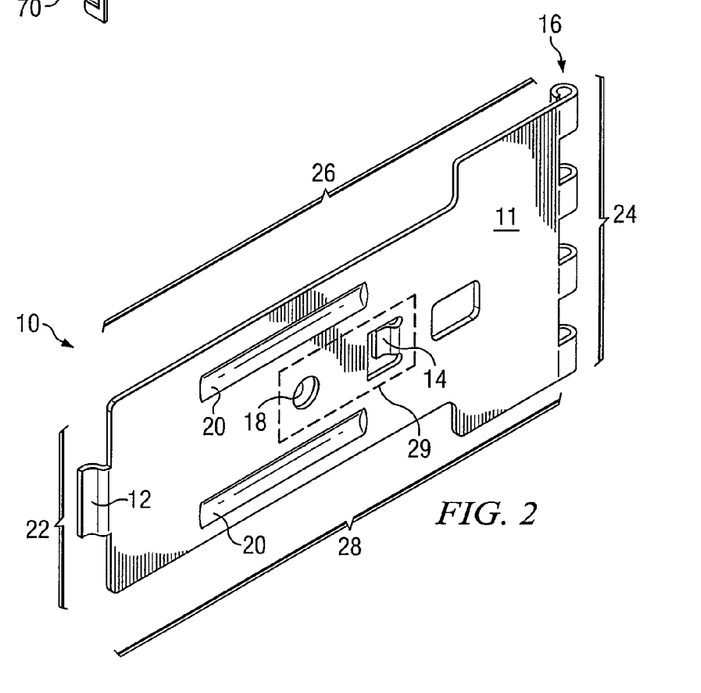
FIG. 2 shows an enlarged isometric view of a CMA attachment bracket according to teachings of the present disclosure.

FIG. 2 shows an enlarged view of a cable management attachment bracket 10, as described above.

Figures 3, 4:
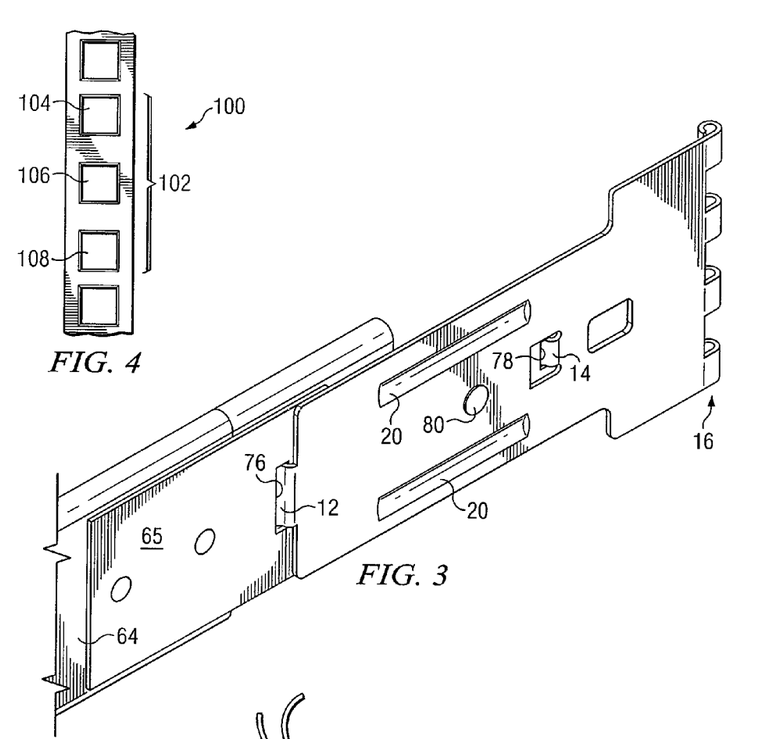
FIG. 3 shows a cable management attachment bracket secured to a rack slide assembly.
FIG. 4 is a view of an interface portion of a rack rail.

Now referring to FIG. 3, a depiction of cable management attachment bracket 10 attached to slide bracket 65. As shown, locking button 80 of slide bracket is in a locking position and interfaced with button receiving aperture 18. Additionally, first attachment tab 12 is inserted into and interfaced with receiving portion 76. Second attachment tab 14 is interfaced with receiving portion/receiving tab 76.

Now referring to FIG. 4, the standard interface portion of a rack rail depicted generally at 100 is shown. The standard interface 100 is made up of multiple mounting units 102, in accordance with EIA standard 310. Each mounting unit 102 includes a first aperture 104, a second aperture 106, and a third aperture 108.

Now referring to FIG. 5A, a rack, depicted generally at 120, is shown. Rack 120 includes a top 122, a bottom 124, four rack rails 128 (where each rack rail has a standard interface 100), a rack front 125 and a rack rear 126. As depicted, rack slide assemblies 60 are installed within rack 120. Specifically, front rack interface brackets 66 and rear rack interface brackets are connected with the standard interface portions 100 of rack rails 128.

As shown in the present embodiment, rack slide 64 is in a retracted or nested position.

FIG. 5B shows an exemplary view of the installation of rack slide assemblies 60. As shown, rack interface tabs 70 are aligned with apertures of standard interface 100 and inserted through the standard interface apertures. The present embodiment shows an attachment bracket 66 design for a 2U vertical rack space. Of course, the present disclosure is applicable to slide assemblies and information handling system components designed to fit in larger or small vertical rack spaces.

Now referring to FIG. 6A, rack 120 is shown with slide members 64 in an extended position. As shown, slide members 64 includes apertures 154 for securing an information handling system component (as shown in FIG. 7). Note that in alternate embodiments, slots may be formed in slide member 64 to allow information handling systems components to be tool-lessly associated with slide members. Such interface may be referred to as a "drop and lock" system.

FIG. 6B depicts the installation of cable management attachment bracket 10 to slide bracket 65. As shown, first attachment tab 12 is preferably aligned and inserted into first receiving portion 76 along the path of arrow 150. At the same time, second attachment tab is preferably aligned with and interfaced with second receiving portion 78. After first tab 12 and second tab 14 are aligned with receiving portions 76 and 78, bracket body 11 slides forward such that locking button 80 protrudes through aperture 18.

Now referring to FIG. 7, the installation of information handling system component chassis 154 into rack 120 is shown. Component chassis 154 preferably includes connection points 155 on its sides. In the present embodiment connection points 155 are threaded apertures formed to allow threaded fasteners to secure component chassis 154 to slide members 64. After chassis 154 is secured to slide members 64, chassis 154 and slide members 64 may slide back into rack 120, in a retracted or nested position.

Figure 8:
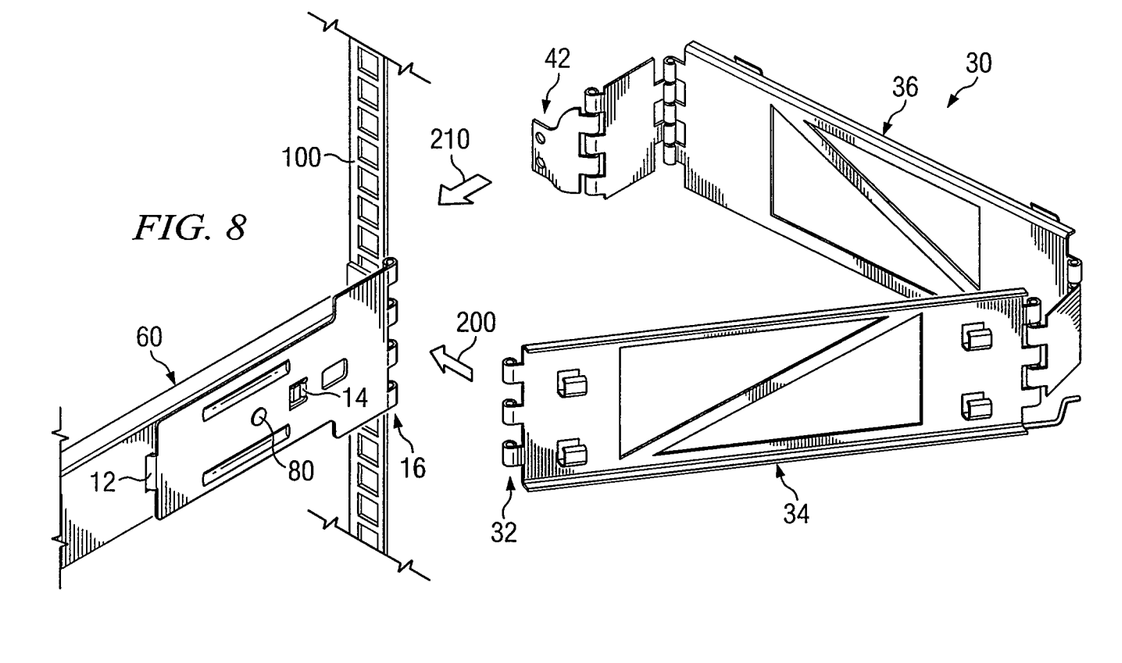
FIG. 8 shows the attachment of a CMA to a cable management attachment bracket.

Now referring to FIG. 8, a depiction of the installation of a CMA 30 to rack interface 100 and cable management attachment bracket 10. As shown, bracket connector 32 is aligned with CMA connection point 16 in the direction of arrow 200. Additionally, rack connector 42 is aligned with interface portion 100 of a rack rail in the direction of arrow 210. As the apertures of rack connector 42 are aligned with standard interface 100, fasteners may be used to secure rack connector 42 to interface portion 100.

Figure 9:
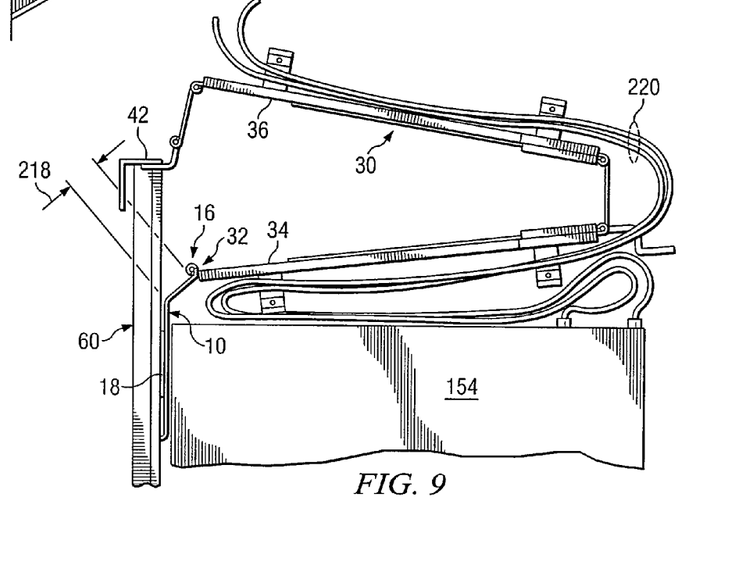
FIG. 9 is an overhead view of a CMA hingedly secured to a cable management attachment bracket according to teachings of the present disclosure.

FIG. 9 shows a cable management attachment bracket 10 installed and in use. As shown, installed cable management attachment bracket 10 is nested between chassis 154 and rack slide assembly 60. The additional thickness provided by embosses 18 provides for an interference fit between chassis 154 and slide assembly 60 providing an advantageous resistance to the torque provided by the weight of CMA 30. Note that in the present embodiment, cable management attachment bracket has an offset 218 that extends outward from slide assembly 60. As shown, cabling 220 associated with chassis 154 is secured along first arm 34 and second arm 36 of CMA 30. As chassis 154 is pulled forward to an extended position, CMA 30 extends forward.

Although the disclosed embodiments have been described in detail, it should be understood that various changes, substitutions and alterations can be made to the embodiments without departing from their spirit and scope.

What is claimed is:

1. A cable management attachment bracket comprising:
   a bracket body, the bracket body having a first attachment tab, a second attachment tab, and a cable management assembly (CMA) connection point for hingedly connecting with a CMA;
   the first attachment tab extending from a front edge of the bracket body and formed to interface with a first receiving slot of a rack slide;
   the second attachment tab extending from a center portion of the bracket body and formed to interface with a second receiving slot of a rack slide; and
   the CMA connection point formed on a rear edge of the bracket body.

2. The bracket of claim 1 further comprising a button receiving aperture formed to interface with a locking button associated with the rack slide.

3. The bracket of claim 1 further comprising a raised emboss formed in the center portion of the bracket body.

4. The bracket of claim 3 further comprising the emboss having a thickness selected to provide an interference fit between an information handling system component chassis and the rack slide.

5. The bracket of claim 3 further comprising the emboss having a thickness selected to contact an information handling system component chassis and the rack slide operable to resist a torque from the associated CMA.

6. The bracket of claim 1 wherein the CMA connection point comprises a hinged connection point formed to interface with a cable management attachment bracket connector.

7. The bracket of claim 1 further comprising the first attachment tab and the second attachment tab formed to tool-lessly secure the cable management attachment bracket with the slide member.

* * * * *